United States Patent [19]
Micheloni et al.

[11] Patent Number: 6,069,837
[45] Date of Patent: May 30, 2000

[54] ROW DECODER CIRCUIT FOR AN ELECTRONIC MEMORY DEVICE, PARTICULARLY FOR LOW VOLTAGE APPLICATIONS

[75] Inventors: Rino Micheloni, Turate; Giovanni Campardo, Bergamo; Donato Ferrario, Carugate; Stefano Ghezzi, Treviolo, all of Italy

[73] Assignee: STMicroelectronics, S.r.l., Agrate Brianza, Italy

[21] Appl. No.: 09/222,022

[22] Filed: Dec. 29, 1998

[30] Foreign Application Priority Data

Dec. 31, 1997 [EP] European Pat. Off. ............. 97830739
Jul. 28, 1998 [EP] European Pat. Off. ............. 98114061

[51] Int. Cl.[7] ...................................................... G11C 8/00

[52] U.S. Cl. .............................. 365/230.06; 365/189.11

[58] Field of Search ......................... 365/230.06, 189.11, 365/185.23

[56] References Cited

U.S. PATENT DOCUMENTS

| | | | |
|---|---|---|---|
| 4,807,190 | 2/1989 | Ishii et al. | 365/189 |
| 5,010,259 | 4/1991 | Inoue et al. | 307/482 |
| 5,555,216 | 9/1996 | Drouot | 365/230.06 |
| 5,602,796 | 2/1997 | Sugio | 365/230.06 |
| 5,673,225 | 9/1997 | Jeong et al. | 365/230.06 |

*Primary Examiner*—Tan T. Nguyen
*Attorney, Agent, or Firm*—Theodore E. Galanthay; Kevin S. Ross; Seed and Berry LLP

[57] ABSTRACT

A row decoding circuit for an electronic memory cell device, particularly in low supply voltage applications, is described. The row decoding circuit is adapted to boost, through at least one boost capacitor, a read voltage to be applied to a memory column containing a memory cell to be read. The circuit is powered between a first supply voltage reference and a second ground potential reference, and comprises a hierarchic structure of cascade connected inverters and a circuit means of progressively raising the read voltage level dynamically. First means are provided for raising the read voltage level to a value equal to the supply voltage plus a threshold voltage, and second means are provided for raising the read voltage level to a value equal to the supply voltage plus twice said threshold voltage.

20 Claims, 5 Drawing Sheets

ROW DECODER CIRCUIT FOR AN ELECTRONIC MEMORY DEVICE, PARTICULARLY FOR LOW VOLTAGE APPLICATIONS

TECHNICAL FIELD

This invention relates to a row decoding circuit for an electronic memory cell device, particularly in low supply voltage applications.

In particular, the invention relates to a circuit for boosting, through a boost capacitor (Cboost), a read voltage to be applied to a memory row including a memory cell to be read, said circuit being powered between a supply voltage reference and a ground potential reference.

BACKGROUND OF THE INVENTION

As is known, in a memory device employing a floating gate n-channel MOS (NMOS) transistor as an elementary cell, the possibility to modulate the threshold voltage of the NMOS elementary cell is used to discriminate between two logic states.

The virgin state of the memory cell, characterized by absence of charge from the floating gate of the transistor, is conventionally taken to represent a first logic state, or logic "1", while the programmed state of the cell is taken to represent a second logic state, or logic "0". In particular, the programmed state is characterized by the number of electrons in the floating gate being sufficient to produce a substantial rise in the threshold voltage of the cell.

During a reading phase, the memory cell is biased with a gate-source voltage which equals the supply voltage to the memory device, with the source terminal being brought to a ground value and the drain terminal to a value of about 1V.

If the cell has been written, its threshold voltage is higher than the supply voltage, and no current will flow through it. In a dual way, if the cell has been erased, its threshold voltage should be such that a current can flow through it.

In the instance of a memory device, specifically of the FLASH type, organized into a matrix of rows and columns of cells, the memory column containing the cell of interest is connected to a read voltage reference, and the current flowing through that column is sensed by a specially provided sense amplifier. Sensing the current flow through the memory column allows written cells to be discriminated from erased cells.

The range of threshold voltage values of a plurality of memory cells following electric erasing lies typically between 0.5V and 2.5V. To ensure proper reading from the memory device, this range is to comply with suitable design specifications.

Specifically, the bottom limit of this range is set to ensure that there are no depleted cells (i.e., cells with a threshold voltage below zero), and to avoid damaging the thin oxide while the memory cell is being read, the top limit being tied to the inherent width of the range, in turn related to the manufacturing process.

With a read voltage that is normally the same as the supply value, supply voltages above 3V pose no problems. Problems are encountered at low supply voltages, typically of about 2.5V, when erased memory cells with threshold voltages close to the top limit of the above range drain insufficient current, and are read as written memory cells.

A widely employed solution to the problem of false readings comprises a row decoding circuit which applies a boosted read voltage to an addressed memory row containing a memory cell to be read.

A higher read voltage than the supply voltage is thus delivered to the memory cells to be read, while retaining the threshold voltage ranges of the erased cells. This boosted read voltage is usually generated from a booster circuit.

Several embodiments of the booster circuit are currently available which are based on the above principle.

1) Continuous Boost

In this first embodiment, suitable clock pulses are delivered to the booster circuit from a clock circuit, whenever a reading phase is to be carried out, which charge a boost capacitor included in the booster circuit, thereby raising an output read voltage from the booster circuit to a value above the supply voltage. The boost capacitor will then hold the read voltage at a desired boosted value.

This first known embodiment allows small boost capacitors to be used, since the boosted read voltage is generated in a series of small increments. Due to the same way of operating, however, the time taken to initially charge the boost capacitor is fairly long, resulting in increased access time for the power-up phase, or reversion from power-down, and for the reversion from standby phase.

In particular, to reduce the delay for reversion from standby, a second, smaller size booster circuit may be used conventionally which holds the main boost capacitor charged even in the standby mode. But the introduction of the second booster circuit has a drawback in that the memory device as a whole is caused to consume power even in the standby mode. Current specifications for memory devices require instead that no power be consumed in the standby mode.

2) Global Pulsed Boost

This second embodiment provides for the use of a very large size boost capacitor. Boosted is, in fact, the whole row decoding circuitry.

The boost capacitor is charged (boost phase) by a single pulse at a predetermined time, e.g., on the occurrence of a switch signal for the reading phase or for the enabling phase of the memory device (e.g., for reversion from the standby phase).

This second embodiment does solve the problems of access time for the power-up and reversion from standby phase, without involving unnecessary power consumption. However, the provision of a large size boost capacitor with its drive circuits requires more area for the memory device as a whole.

In addition, this second known embodiment introduces new problems related to the timing of the capacitor boost phase.

3) Local Pulsed Boost

In this third embodiment, the boost phase is only used when actually needed, so that the advantages of the first and second embodiments above can be retained.

A row decoding circuit 1 based on this principle is shown diagrammatically in FIG. 1 and described in detail in European Patent Application No. 96830345.3, filed on Jun. 18, 1996 by this Applicant.

The row decoding circuit 1 with local pulsed boost is connected between a supply voltage reference Vcc and a ground potential reference GND, and has first 2 and second 3 control terminals, and first 4 and second 5 input terminals.

In particular, the first input terminal 4 receives an n-th row enable signal P1 for a memory device connected to the row decoding circuit 1, while the second input terminal 5 receives an (n+1)-th row enable signal P2. The enable signals P1 and P2 are mutually exclusive.

The first control terminal 2 receives a general enable signal CONTROL and is connected to the gate terminal of a control transistor M5, in turn connected between the supply voltage reference Vcc and a node X to be boosted. The second control terminal 3 receives a drive signal Vgc.

The control transistor M5 is a P-channel MOS (PMOS) transistor having its body terminal connected to its drain terminal, in turn connected to the second control terminal 3 through an n-th row decoding final inverter 6 and an (n+1)-th row decoding final inverter 8.

The node X to be boosted is further connected to one end of a boost capacitor Cboost having the other end connected to the supply voltage reference Vcc through a limitation circuit 10 which comprises, in particular, a PMOS transistor M6 in a diode configuration, having its body terminal connected to its drain terminal and to the boost capacitor Cboost.

The row decoding final inverters 6 and 8 of the circuit 1 are CMOS inverters comprising complementary NMOS/PMOS transistor pairs. The operation of these final inverters is controlled by turning on and off respective enable PMOS transistors M3 and M2 thereof.

The n-th row decoding final inverter 6 has a first central connection terminal Y1 connected to an n-th row equivalent impedance block 11, and a second central connection terminal of a row decoding final inverter 7 which has another central connection terminal connected to the first input terminal 4.

The (n+1)-th row decoding final inverter 8 similarly has a first central connection terminal Y3 connected to an (n+1)-th row equivalent impedance block, and a second central connection terminal Y4 connected to a central connection terminal of a row decoding final inverter 9 having, in turn, another central connection terminal connected to the second input terminal 5.

The row decoding final inverters 7 and 9 of the circuit 1 also are CMOS inverters comprising complementary NMOS/PMOS transistor pairs, and their operation is controlled by turning on and off respective enable PMOS transistors M1 and M4 thereof.

Let us see now the operation of the row decoding circuit 1 with local pulsed boost, according to the prior art.

The general enable signal CONTROL controls the 'off' state of the control transistor M5, the transistor being adapted to power the row decoding final inverters 6 and 8 of the circuit 1. In particular, the signal CONTROL should turn off M5 before the arrival of the boost pulse, not to dissipate the charge stored in the boost capacitor Cboost.

The limitation circuit 10, and specifically the limitation transistor M6 thereof, is formed in the proximity of the remote end of the boost capacitor Cboost from the node X to be boosted, such that any excess charge in the boost capacitor Cboost can be dissipated through said transistor M6 and the voltage at the node X to be boosted cannot exceed a limitation value LIM equal to the sum of the supply voltage Vcc plus the threshold voltage Vtp of the PMOS transistor M6.

This is an essential condition to the operation of the row decoding circuit 1 because, upon the voltage at the node X to be boosted exceeding the above limitation value LIM, all the row decoding final inverters, i.e., the inverters 6 and 8 in the example of FIG. 1, might be turned on. In fact, for the row decoding circuit to operate properly, only the inverter of the selected row should be 'on', and all the others left 'off'.

To obtain a memory configuration wherein the n-th row is "high" (P1=Vcc) and the (n+1)-th row grounded (P2=0), as exemplified in FIG. 1, the row decoding circuit 1 must ensure that the enable transistor M3 of the n-th row decoding final inverter 6 is 'on' and the enable transistor M2 of the (n+1)-th row decoding final inverter 8 is 'off'.

As can be appreciated from the schematics of FIG. 1, the enable transistor M2 is driven from the control transistor M4, being supplied the voltage Vcc, and accordingly, has its gate terminal at Vcc; therefore, the transistor M2 is held 'off' so long as its source terminal, corresponding to the node X to be boosted, is at a voltage value below the limitation value LIM.

This leads back to the essential condition for proper operation of the row decoding circuit 1: the boost voltage Vboost at the node X to be boosted, as provided by the boost capacitor Cboost, should be limited to the sum of the supply voltage Vcc plus the threshold voltage of a PMOS transistor, of the same type of those employed in the final inverters, in an effective manner, and its operation should be clocked without in any way affecting the other functions of the row decoding circuit 1.

The advantages and disadvantages of conventional row decoding circuits are summarized in the following Table:

TABLE I

| Boost Type | Advantages | Disadvantages |
|---|---|---|
| Continuous Boost | Compact. Good performance. | Power consumption in standby mode. Delays in the reversion from standby. |
| Global Pulsed Boost | No delays in the reversion from standby. No power consumption in standby mode. | Space requirements difficult to manage. |
| Local Pulsed Boost | No delays in the reversion from standby. No power consumption in standby mode. Pulse is more easily generated. | Limited boost voltage Vboost |

Thus, the third local pulse boosted embodiment retains the advantages of the first two embodiments, i.e., near zero delay in reverting from the standby mode and no power consumption while in that mode. On the other hand, it has a shortcoming in that it can only be used for limited boost voltages Vboost.

This is disadvantageous especially where the memory device connected to the row decoding circuit is operated on low supply voltages. The use of low supply voltages has become a necessity in the field of integrated circuits mainly on account of a demand for low power consumption which is most pressing where the application concerns portable devices, such as cellular phones.

The integrated circuits currently employed in cellular phone applications must be designed for operation on supply voltages within the range of 2.7 to 3.6V, a range that would have to be even wider at the integrated circuit testing stage to ensure its proper operation under different real conditions.

Furthermore, a current market trend favors a shift of that operating range to 1.8V. Thus, the whole circuitry is to be re-designed for operation within this new voltage range.

Whereas for a minimum value of 2.5V of the supply voltage, the proper operation of the row decoding circuit is ensured by a limitation value LIM of the boost voltage Vboost equal to the supply voltage and by a threshold voltage of a PMOS transistor (equal to 0.8V, for example), a minimum value of 1.8V requires that the boost voltage Vboost be increased.

SUMMARY OF THE INVENTION

An embodiment of this invention provides a row decoding circuit which can operate reliably even at low supply voltages to the memory device connected thereto, the row decoding circuit having thus adequate structural and functional characteristics to overcome the limitations of prior art circuits.

The embodiment arranges for a fully dynamic row decoding wherein the level of the boost voltage is raised progressively.

In particular, the level of the boost voltage is raised from the value of the supply voltage to a first limitation value equal to the sum of the supply voltage plus a threshold voltage, and subsequently to a second limitation value equal to the sum of the supply voltage plus twice said threshold voltage.

To do that, the row decoding circuit utilizes, not only the last decoding final inverters, but also the last but one of said inverters, according to a hierarchic structure of row addressing.

The features and advantages of the circuit according to this invention will be apparent from the following description of an embodiment thereof, given by way of non-limitative example with reference to the accompanying drawings.

DETAILED DESCRIPTION

Figure 1:
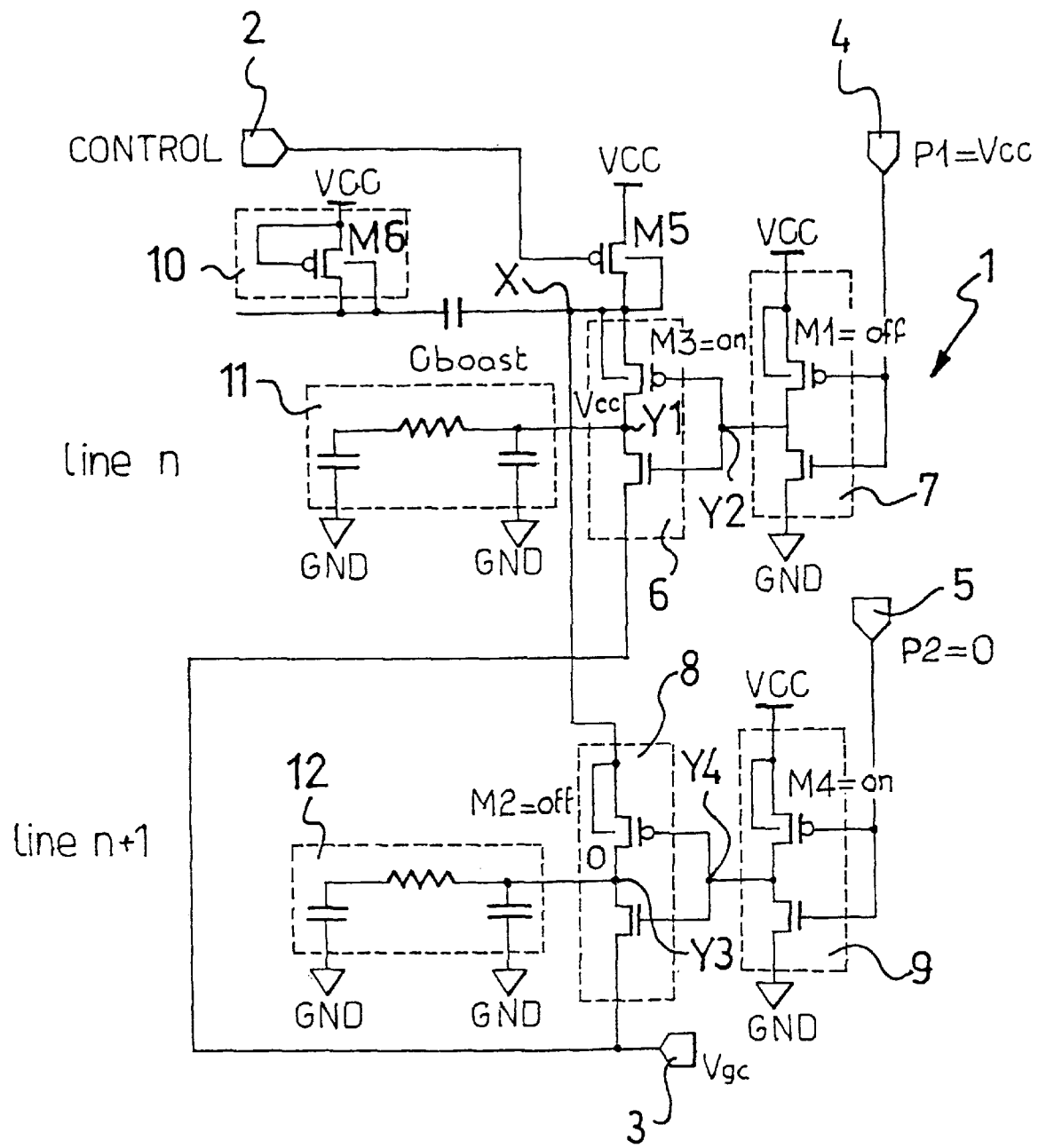
FIG. 1 shows diagrammatically a row decoding circuit according to the prior art.
Figure 2:
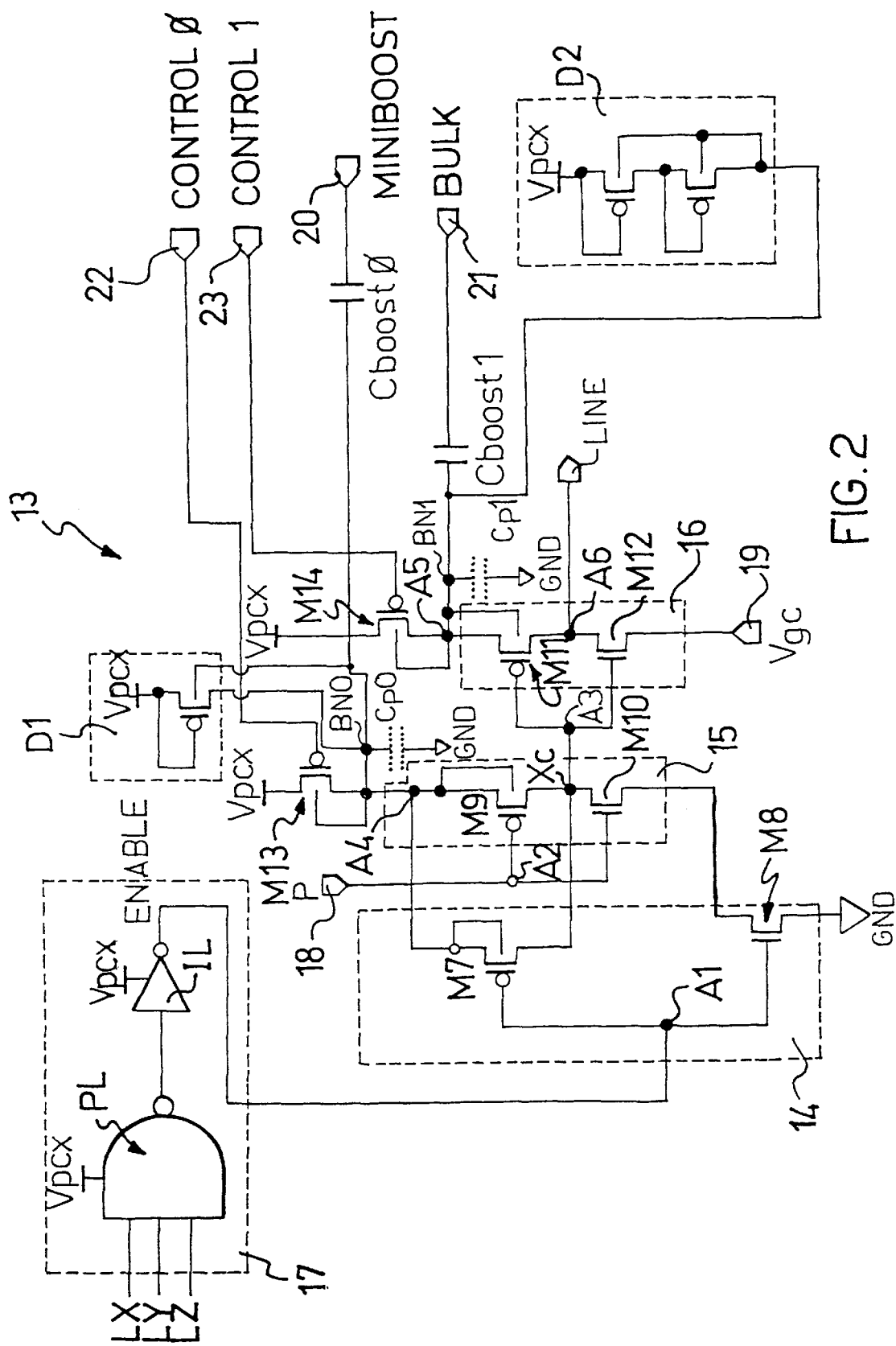
FIG. 2 shows diagrammatically a row decoding circuit according to the invention.

Referring in particular to FIG. 2, generally and schematically shown at 13 is a row decoding circuit with hierarchic structure according to the invention.

The hierarchical row decoding circuit 13 is connected between a control voltage reference Vpcx and a ground potential reference GND, and comprises an input structure 14 and first 15 and second 16 decoding final inverters.

As with the row decoding circuit 1 previously described in connection with the prior art, the decoding final inverters 15 and 16 are CMOS inverters comprising complementary pairs of NMOS/PMOS transistors, and their operation is controlled by turning on and off respective enable PMOS transistors therein. Likewise the input structure 14 comprises a pair of complementary NMOS/PMOS transistors.

In particular, the input structure 14 comprises a PMOS transistor M7 and an NMOS transistor M8 which have their gate terminals in common to form a first internal circuit node A1, in turn connected to a global enable block 17 of the hierarchical row decoding circuit 13.

In addition, the first decoding final inverter 15 comprises an enable PMOS transistor M9 and an NMOS transistor M10 which have their gate terminals in common to form a second internal circuit node A2, in turn connected to an enable input terminal 18 of the hierarchical row decoding circuit 13, while the second decoding final inverter 16 comprises an enable PMOS transistor M11 and an NMOS transistor M12 having their gate terminals in common to form a third internal circuit node A3, in turn connected to a central node Xc of the transistors M9 and M10 of the first decoding final inverter 15.

The enable input terminal 18 receives a first pre-decoding signal P.

The global enable block 17 comprises a logic gate PL of the NAND type with three inputs, which is supplied the control voltage Vpcx and has its output connected to a logic inverter IL. The logic gate PL receives second LX, third LY and fourth LZ pre-decoding signals, while the logic inverter IL, which is also supplied the control voltage Vpcx, outputs a global enable signal ENABLE.

The first PMOS transistor M7 in the input structure 14 has its body terminal connected to its source terminal and to a fourth internal circuit node A4, and has its drain terminal connected to the central node Xc of the transistors M9 and M10 and to the third internal circuit node A3. The NMOS transistor M8 has its source terminal connected to the ground potential reference GND, and its drain terminal connected to the source terminal of the NMOS transistor M10 of the first decoding final inverter 15.

Furthermore, the enable PMOS transistor M9 of the first decoding final inverter 15 has its body terminal connected to its source terminal and to the fourth internal circuit node A4, and has its drain terminal in common with the drain terminal of the NMOS transistor M10 to form the central node Xc.

Finally, the enable PMOS transistor M11 of the second decoding final inverter 16 has its body terminal connected to its source terminal and to a fifth internal circuit node A5, and has its drain terminal in common with the drain terminal of the NMOS transistor M12 to form a sixth internal circuit node A6, in turn connected to an addressed row connection terminal LINE.

The NMOS transistor M12 of the second decoding final inverter 16 also has a source terminal connected to a drive terminal 19.

The drive terminal 19 receives a drive signal Vgc.

The hierarchical row decoding circuit 13 further comprises first M13 and second M14 control transistors which are connected between the control voltage reference Vpcx, and respectively the fourth A4 and fifth A5 internal circuit nodes.

In particular, the first control transistor M13 is a P-channel MOS (PMOS) transistor having its body terminal connected to its drain terminal and to a first node BN0 to be boosted, in turn connected to a first boost control terminal 20 through a first boost capacitor Cboost0. Likewise, the second control transistor M14 is a P-channel MOS (PMOS) transistor having its body terminal connected to its drain terminal and to a second node BN1 to be boosted, in turn connected to a second boost control terminal 21 through a second boost capacitor Cboost1.

Advantageously in this invention, said first and second boost control terminals 20 and 21 receive first MINIBOOST and second BULK boost control signals from a boost signal generator, not shown in FIG. 2 and including said first and second boost capacitors Cboost0 and Cboost1.

Furthermore, the first M13 and second M14 control transistors have their gate terminals connected to first 22 and second 23 control terminals which receive first CONTROL0 and second CONTROL1 control signals, respectively.

Shown in dotted lines in FIG. 2 are also parasitic capacitances Cp0 and Cp1 associated with the nodes BN0 and BN1 to be boosted.

It should be noted that these nodes BN0, BN1 to be boosted are respectively connected to the fourth A4 and fifth A5 internal circuit nodes, and therefore, to the first 15 and second 16 decoding final inverters.

For the hierarchical row decoding circuit 13 to operate as expected, the voltage value at the second node BN1 to be boosted should be limited to twice Vtp, that is twice the threshold voltage of a PMOS transistor of the same type as used in the final inverters, and the voltage value at the first node BN0 limited to Vtp.

Thus, the hierarchical row decoding circuit 13 shown in FIG. 2 is obtained which comprises first D1 and second D2 limitation diodes connected between the control voltage reference Vpcx and, respectively, the first BN0 and second BN1 nodes to be boosted.

The first limitation diode D1, moreover, is suitably connected to the first node BN0 to be boosted.

Figure 4:
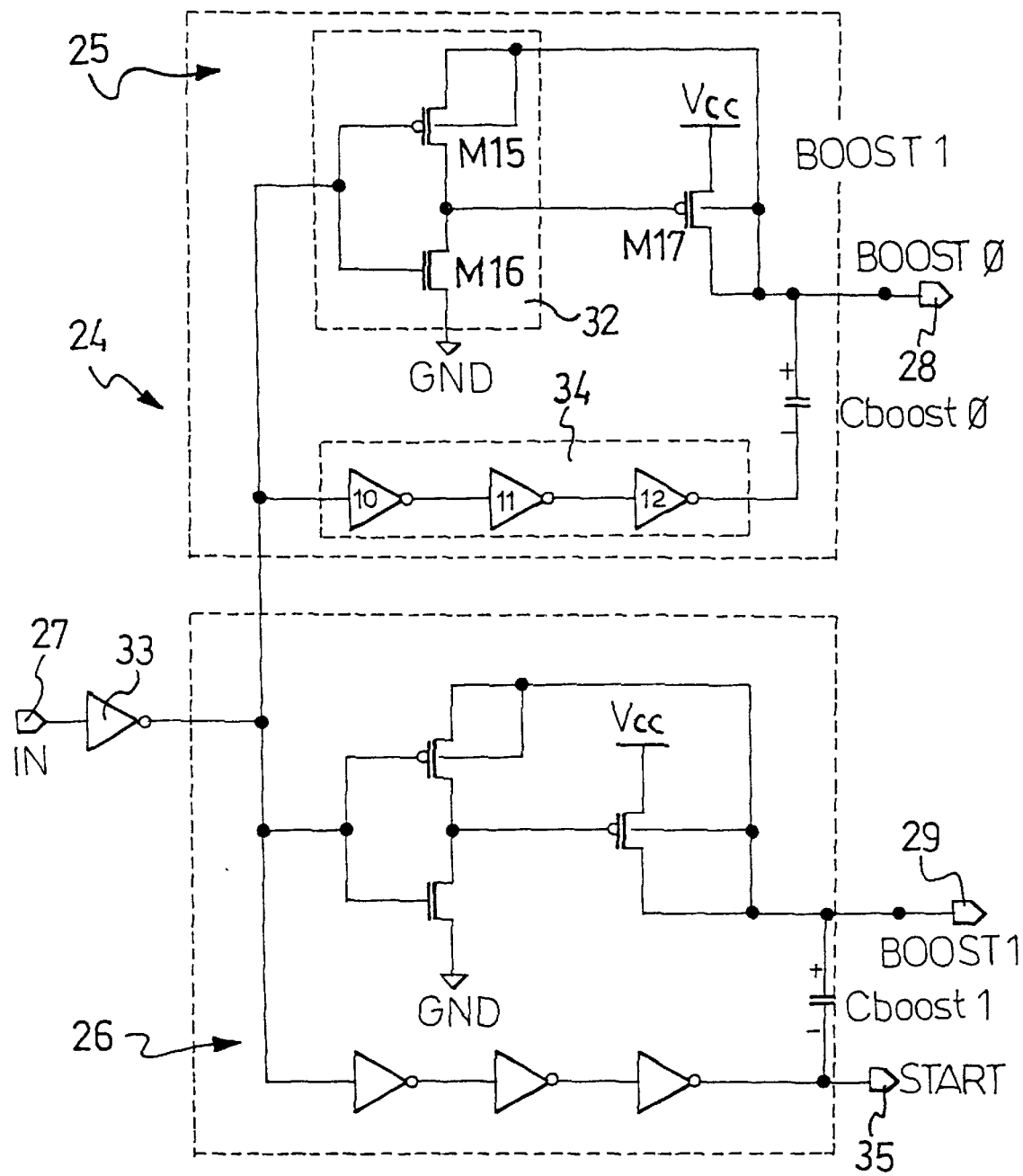
FIG. 4 shows an example of a booster circuit adapted for use in connection with the circuit of FIG. 2.

FIG. 4 shows in diagrammatic form a possible simplified embodiment of a boost signal generator 24 for generating the boost control signals MINIBOOST and BULK used in the hierarchical row decoding circuit 13.

In particular, this boost signal generator, generally denoted by 24, has first 25 and second 26 logic chains which are identical with each other and connected between an input terminal 27 and, respectively, first 28 and second 29 boost terminals.

The input terminal 27 receives an input signal IN, while the first 28 and second 29 boost terminals deliver first BOOST0 and second BOOST1 boost control signals.

The first logic chain 25 of the boost signal generator 24 comprises a CMOS inverter 32, in turn comprising an enable PMOS transistor M15 and an NMOS transistor M16 connected to the ground potential reference GND.

The transistors M15 and M16 have their gate terminals in common and connected to the input terminal 27 through a logic inverter 33. In addition, the enable PMOS transistor M15 has its source and body terminals in common and connected to the common drain and body terminals of a further PMOS transistor M17 which has its source terminal connected to the voltage reference Vcc and its gate terminal connected to the common drain terminals of the transistors M15 and M16.

The first logic chain 25 further comprises an inverter chain 34 comprising, in the particular example shown, three logic inverters connected, in turn, to the input terminal 27 of the boost signal generator 24 through the logic inverter 33, and to the drain terminal of the transistor M17 through the first boost capacitor Cboost0.

The second logic chain 26 is connected between the input terminal 27 and the second boost terminal 29, and has a similar construction to that of the first logic chain 25, it comprising, in particular, the second boost capacitor Cboost1 and an output terminal 35 delivering an output signal START.

Where used in connection with the hierarchical row decoding circuit 13, the boost signal generator 24 has the first boost terminal 28 connected to the first node BN0 to be boosted and the second boost terminal 29 connected to the second node BN1 to be boosted. Furthermore, the generator 24 is connected to the control voltage reference Vpcx employed in the hierarchical row decoding circuit 13.

The operation of the hierarchical row decoding circuit 13 will now be described.

This hierarchical row decoding circuit 13 effects, in particular, a fully dynamic row decoding wherein the voltage levels of the nodes to be boosted are raised progressively from Vcc to (Vcc+Vtp), and then to (Vcc+2Vtp) through the second to last and the last of the decoding final inverters, Vtp being the threshold voltage of a PMOS transistor.

The circuit shown in FIG. 2 uses a row addressing structure of the hierarchic type which is organized into four levels, corresponding to the pre-decoding signals LX, LY, LZ and P.

It should be appreciated that the diagram of FIG. 2 only depicts the drive portion for a single row.

The drive signal Vgc, applied to the source terminal of the NMOS transistor M12 of the second decoding final inverter 16, is normally grounded and brought to a negative value where a so-called negative gate erasing is used, as is the case with triple-well processes.

The control voltage reference Vpcx corresponds to the value of the supply voltage Vcc, during the reading phase of the addressed row through the connection terminal LINE, while it takes a higher value during the programming phase of the same.

The reading phase by the hierarchical row decoding circuit 13 will now be analyzed in further detail.

The voltage value at the second node BN1 to be boosted should be limited to twice Vtp, that is, twice the threshold voltage of a PMOS transistor, whereas the voltage value at the first node BN0 to be boosted should be limited to Vtp.

Let us see first what happens at an addressed memory row.

A memory row is selected by bringing the pre-decoding signals LX, LY, LZ and P simultaneously to a high logic value. In this condition, the global enable signal ENABLE will also be at a logic high, thereby enabling the first decoding final inverter 15 that comprises the transistors M9 and M10.

At the same time as the first decoding final inverter 15 is enabled, the boost of the nodes BN0 and BN1 to be boosted is triggered. In particular, the voltage at the first node BN0 to be boosted is raised to a value (Vcc+Vtp), while the voltage at the second node BN1 to be boosted attains a value (Vcc+2Vtp).

During the boost phase, the control signals CONTROL0 and CONTROL1 turn off the first and second control transistors M13 and M14, respectively.

Accordingly, the enable PMOS transistor M9 of the first decoding final inverter 15 will be 'off' and has a threshold voltage of zero value. As a result, the voltage at the central node Xc of the transistors M9 and M10 will be zero, which turns on the transistor M11 and allows the voltage at the second node BN1 to be boosted to pass on to the addressed row via the connection terminal LINE.

Thus, the voltage supplied to the addressed row is a boosted to (Vcc+2Vtp).

To now see what happens at the unaddressed rows, the following cases should be considered:

1) LX, LY and LZ=1, P=0

The global enable signal ENABLE is high (i.e., has the same value as the supply voltage Vcc), the PMOS transistor M7 and NMOS transistor M10 are 'off', while the enable PMOS transistor M9 is 'on' and transferring the voltage (Vcc+Vtp) to the central node Xc of the transistors M9 and M10 in the first decoding final inverter 15.

The value of the voltage at the second node BN1 to be boosted is (Vcc+2Vtp) and, therefore, the enable PMOS transistor M11 of the second decoding final inverter 16 will be 'off'.

The voltage supplied to an unaddressed memory row will thus be held at the same value as the ground potential reference GND by the NMOS transistor M12 of the second decoding final inverter 16 being instead 'on'.

2) LX, LY, and LZ=0

In this case, the global enable signal ENABLE is at a logic low and disables the NMOS transistor M10 of the first decoding final inverter 15 by turning off the transistor M8. The voltage at the central node Xc of the transistors M9 and M10 is here forced to a value (Vcc+Vtp) by the PMOS transistor M7 of the input structure 14.

Once again, the enable PMOS transistor M11 of the second decoding final inverter 16 will be conducting no current and has a threshold overvoltage of zero value. The NMOS transistor M12 again ensures proper biasing to ground of the unaddressed row.

The operation described so far only applies to the instance of the control voltage reference Vpcx being the same value as the supply voltage Vcc, that is during the reading phase. For operations involving a different value of the control voltage reference Vpcx from the supply voltage Vcc (e.g., during a program, verify or another phase), the phase of boosting the nodes BN0 and BN1 would be disabled and row decoding would be again static, that is operating entirely between the ground GND and control Vpcx voltage values. In particular, the control signals CONTROL0 and CONTROL1 would be biased to ground so as to supply a value, corresponding to the control voltage reference Vpcx, to the addressed row connection terminal LINE for row decoding.

The voltages at the nodes BN0 and BN1 to be boosted are advantageously limited, according to the invention, by providing a diode for limiting BN0 and two diodes for limiting BN1. The limitation diodes D1 and D2 are connected between the nodes to be boosted and the control voltage reference Vpcx. These diodes are implemented by diode-connected PMOS transistors.

In particular, the PMOS transistors used for the limitation diodes D1 and D2 should be the same types as those used for the control transistors of the row decoding circuit, so as to positively power off the PMOS transistors that have, across their source and gate terminals, a difference of potential equal to that of the limitation diode connected thereto.

In fact, the limitation diodes D1 and D2 would limit the voltage value at the first node BN0 to be boosted to Vtp, that is to once the threshold voltage of a PMOS transistor of the same type as those used in the final inverters, and the voltage value at the second node BN1 to be boosted to twice Vtp.

Upon the node to be boosted rising above the threshold of the diode-configured transistor, the latter becomes directly biased and drains away the excess boost charge, thereby providing limitation for the node. To make the process as fast and effective as possible, the diode-connected transistors should be located close to the top plate of the boost capacitors Cboost0 and Cboost1. It is important to observe that the limitation diodes do not interfere with the normal operation of the device, since the PMOS transistors therein are reverse biased; direct biasing is only triggered when boosting is initiated and the threshold value exceeded.

Let us see now the operation of the boost signal generator 24, taking the upper chain 25 as an example. Boosting is initiated by the input signal IN being received at the input terminal 27, which will thus switch from low to high.

If the input signal IN is low, the output of the chain 34 is grounded, and will pull to ground one end of the first boost capacitor Cboost0. The other end of the capacitor Cboost0 is at the same value as the supply voltage Vcc because the low input signal IN causes the inverter 33 output to be high, which turns on the transistors M16 and M17, thereby pre-charging the capacitor Cboost0 to a difference of potential equal to the value of the supply voltage.

When the input signal IN goes high, it turns off the NMOS transistor M16 and turns on the PMOS transistor M15, while at the same time complimenting the inverter chain 34.

The output node of this chain 34 then goes high, and the first boost capacitor Cboost0, which tends to retain its difference of potential from the initial charge, will "push up" the first boost terminal 28.

The first boost control signal BOOST0, brought back to the enable PMOS transistor M15, presently 'on', communicates the voltage value to the gate terminal of the transistor M17, at output voltage, while holding the transistor M17 'off' and the value of the first boost control signal BOOST0 floating, a necessary condition to the boost phase.

The operation of the hierarchical row decoding circuit 13 can be made more reliable by driving the first of two successive decoding final inverters, rather than with a voltage (Vcc+Vtp), with a voltage Vcc+Vtp+ϵ, where ϵ is positive and sufficiently substantial to provide a margin for the undesired turning-on of the last final inverter, the latter being the inverter that acts directly on the gate terminals of the memory cells.

For this purpose, we can use the least utilized terminal of the PMOS transistors, i.e., the body terminal. The relationship for obtaining the value of the threshold voltage of a MOS transistor is known to be:

$$|V_T| = |V_{T0}| + \gamma \cdot \left( \sqrt{2 \cdot (|\phi_P|) + |V_{SB}|} - \sqrt{2 \cdot |\phi_P|} \right)$$

where $\phi p$ is the so-called flat-band voltage, Vsb is the voltage between source and body, and $V_{T0}$ is the threshold value with $V_{SB}=0$, and τ is the body effect coefficient.

Figure 3:
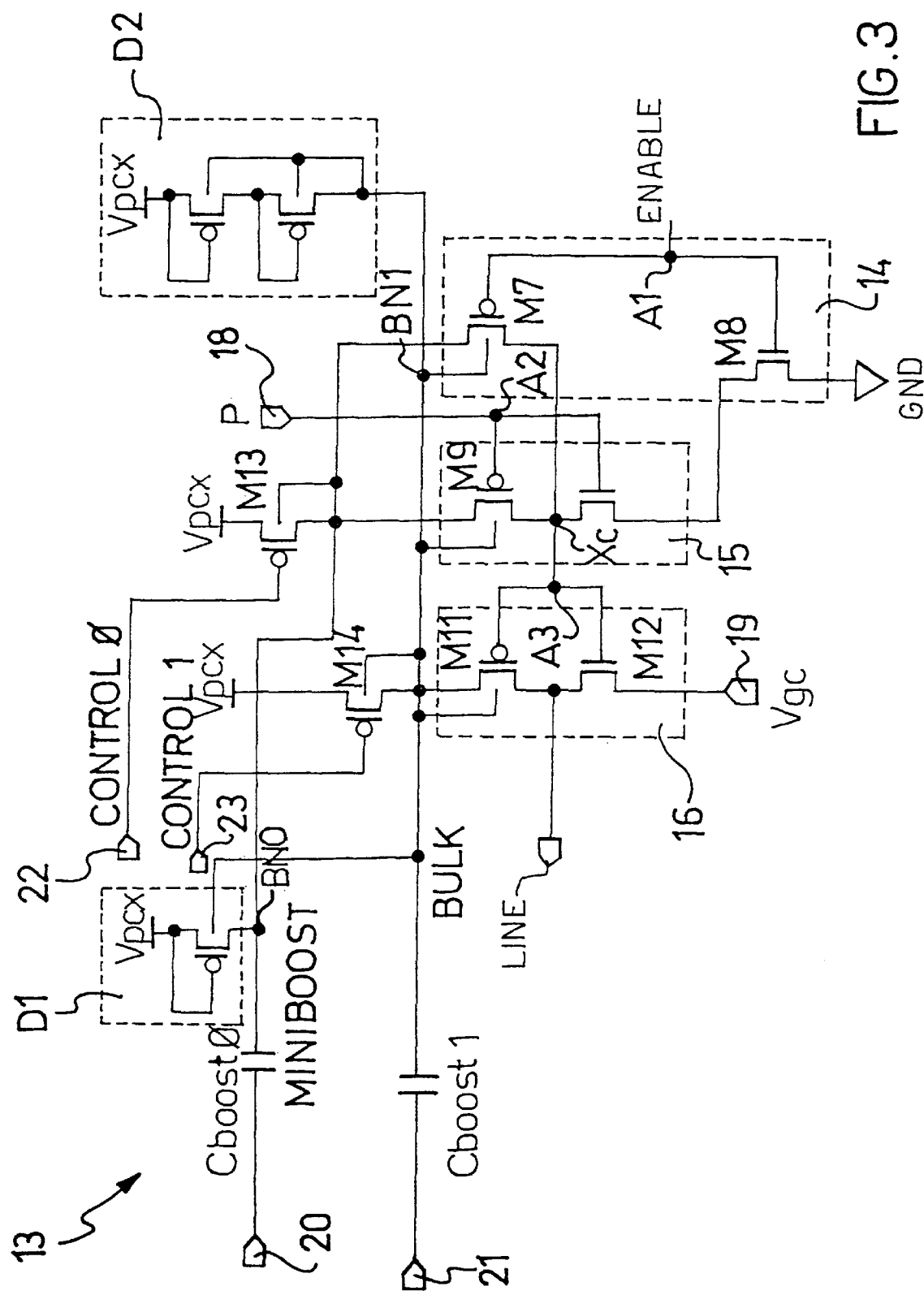
FIG. 3 shows a modification of the circuit in FIG. 2.

The hierarchical row decoding circuit 13 is modified as shown in FIG. 3, with the n-wells of those PMOS transistors which are boosted by the signal MINIBOOST connected to the signal designated BULK, so that these transistors can be further boosted since their thresholds are raised by the contribution of the body effect.

In particular, compared to the configuration of the row decoding circuit shown in FIG. 2, the PMOS transistor M7 of the input structure 14 and the enable PMOS transistor M9 of the first decoding final inverter 15 have their body terminals connected to the BULK line, and hence to the second node BN1 to be boosted.

The diode-connected PMOS transistor in the MINIBOOST circuit of FIG. 3 also should have its n-well connected to the BULK signal, such that its threshold is modified similar to the PMOS transistors of the decoding circuit and can limit the voltage to a higher value.

The body effect is also used to raise the threshold of the enable PMOS transistor M9 in the first decoding final inverter 15, by connecting its body terminal to the highest boost control signal BULK.

Figure 5:
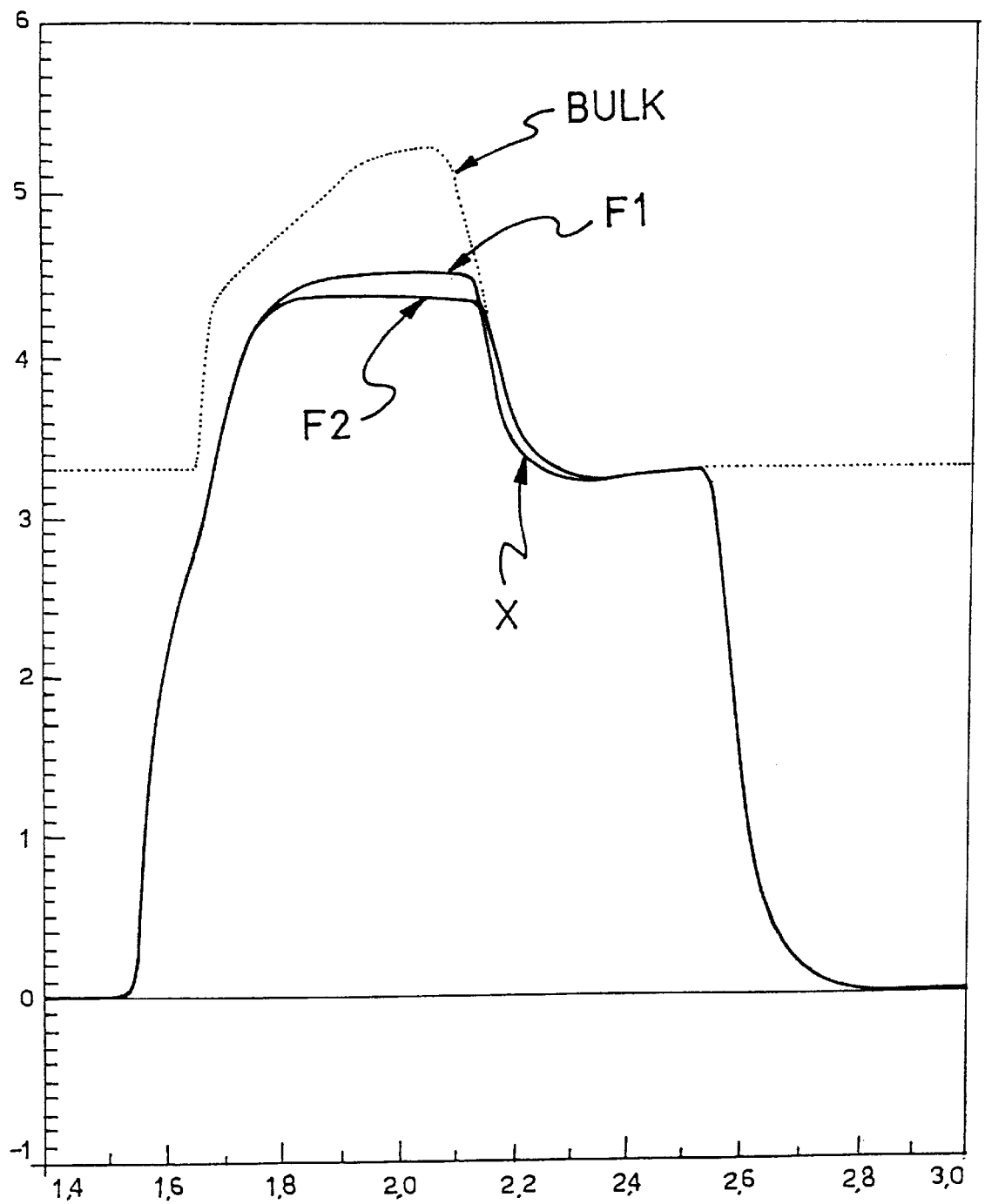
FIG. 5 shows plots of signals of interest in the row decoding circuit according to the invention.

Shown in FIG. 5 is a simulation which illustrates the difference of the voltage values of the first boost control signal MINIBOOST obtained in the instance of boosting operations with (F1) and without (F2) utilizing the body effect, point x indicating the end of the bootstrap phase.

It can be concluded that the hierarchical row decoding circuit disclosed herein allows a local boost phase to be applied to the addressed row connection terminal LINE limited to two thresholds of a p-channel MOS transistor. The PMOS transistor used is that involved in row decoding, and is usually of the high-voltage type in order to withstand the programming voltage. This local boost phase is a boost phase applied to a portion only of the row decoding, not to the whole circuitry connected to the control voltage reference Vpcx, and allows for the use of boost capacitors which are smaller, and hence easier to lay out, than the capacitors employed in conventional global booster circuits.

In addition, the hierarchical row decoding circuit provides an access time from standby which equals the addressing time, the boost phase being a one-shot phase.

It should be further noted that the hierarchical row decoding circuit 13 can be used with very low supply voltages. The supply voltage theoretically attainable with the circuit of this invention is given in particular as:

$$V_{max1} = V_{cc} + 2 \cdot V_{tp}$$

The highest attainable voltage with a single booster stage is therefore:

$$V2 = V_{cc} + V_{cc} \cdot \eta \quad \text{where } \eta = \frac{Cboost}{Cboost + Cp}$$

It can be concluded that when the following condition is satisfied:

$$2*Vtp > Vcc \cdot \eta$$

the limitation to the two PMOS transistor thresholds does not apply, and the row decoding circuit of this invention allows a local boost phase to be effected with the highest voltage attainable by a single booster stage.

Let us consider a numerical example herein below for clarity sake. Assume operation with Vcc=1.8V, Vtp=0.8V, and a factor η=0.8. Then it will be:

$$Vmax1 = 1.8V + 2 \cdot 0.8V = 3.4V$$

$$Vmax2 = 1.8V + 1.8V \cdot 0.8 = 3.24V$$

Thus, at low supply voltages, the boost voltage will not be limited by the structure described herein.

From the foregoing it will be appreciated that, although specific embodiments of the invention have been described herein for purposes of illustration, various modifications may be made without deviating from the spirit and scope of the invention. Accordingly, the invention is not limited except as by the appended claims.

We claim:

1. A row decoding circuit for an electronic memory cell device, being of the type adapted to boost, through a first boost capacitor, a read voltage to be applied to a memory column containing a memory cell to be read, said circuit being powered between a supply voltage reference and a ground potential reference, the row decoding circuit comprising: a hierarchic structure of cascade connected inverters and a circuit means of progressively raising the read voltage level dynamically, said circuit means including first means for raising the read voltage level to a value equal to the supply voltage plus a threshold voltage; and second means for raising the read voltage level to a value equal to the supply voltage plus twice said threshold voltage.

2. A circuit according to claim 1, further comprising an input structure connected to the cascade connected inverters and having an input node which receives an enable signal from an enable block comprising at least one logic gate (PL) which is input a plurality of pre-decoding signals.

3. A circuit according to claim 1 wherein the cascade connected inverters include a last inverter and a second to last inverter, the circuit further comprising first and second control transistors respectively in the second to last and the last inverters of the cascade connected inverters, said first and second control transistors receiving respective control signals on their gate terminals.

4. A circuit according to claim 1, wherein the cascade connected inverters include a second to last inverter and said first means comprise a first boost capacitor having a terminal connected to said second to last inverter and a limitation diode connected between the voltage supply reference and said terminal.

5. A circuit according to claim 4, wherein said limitation diode is a diode-connected PMOS transistor.

6. A circuit according to claim 4, wherein said first boost capacitor has a terminal receiving a control signal from a boost signal generator, said generator comprising first and second logic chains connected in parallel with each other between an input terminal and respective output terminals.

7. A circuit according to claim 1, wherein the cascade connected inverters includes a last inverter and said second means comprise a second boost capacitor having a terminal connected to said last inverter and a double limitation diode connected between the voltage supply reference and said terminal of the second boost capacitor.

8. A circuit according to claim 7, wherein said double limitation diode is formed of a pair of PMOS transistors connected in series with each other and being each in a diode configuration.

9. A circuit according to claim 7, wherein said second boost capacitor has a terminal receiving a control signal from a boost signal generator, said generator comprising first and second logic chains connected in parallel with each other between an input terminal and respective output terminals.

10. A method for controlling the row decoding phase in an electronic memory cell device, said method comprising boosting, through at least one boost capacitor, a read voltage to be applied to a memory row containing a memory cell to be read, raising the boosted voltage level from the value of a supply voltage to a first limitation value equal to the supply voltage plus a threshold voltage, and subsequently, to a second limitation value equal to the supply voltage plus twice said threshold voltage.

11. A row decoding circuit powered between first and second voltage supply references, comprising:
a first inverter having a input node for receiving a control signal, a power terminal at which a first boost voltage is provided, and an output node;
a second inverter having an input node coupled to the output node of the first inverter, a power terminal at which a second boost voltage is provided, and an output node that provides a read voltage;
a first voltage limiter coupled to the power terminal of the first inverter, the first voltage limiter being structured to limit the first boost voltage to a value equal to the first supply voltage reference plus a threshold voltage; and
a second voltage limiter coupled to the power terminal of the second inverter, the second voltage limiter being structured to limit the second boost voltage to a value equal to the first supply voltage reference plus twice the threshold voltage.

12. The row decoding circuit of claim 11, further comprising a first boost capacitor coupled to the power terminal of the first inverter and a second boost capacitor coupled to the power terminal of the second inverter.

13. The row decoding circuit of claim 11 wherein the first voltage limiter includes a limitation diode coupled between the first supply voltage reference and the power terminal of the first inverter, the limitation diode having a threshold equal to the threshold voltage.

14. The row decoding circuit of claim 11 wherein the second voltage limiter includes first and second limitation diodes connected in series between the first supply voltage reference and the power terminal of the second inverter.

15. The row decoding circuit of claim 11 wherein the first inverter includes a pull-up transistor having a body terminal coupled to the power terminal of the second inverter.

16. The row decoding circuit of claim 11, further comprising a first input transistor having a control terminal that receives an enable signal, a first terminal coupled to the power terminal of the first inverter, and a second terminal coupled to the output node of the first inverter.

17. The row decoding circuit of claim 16, further comprising a second input transistor having a control terminal that receives the enable signal, a first terminal coupled to a reference node of the first inverter, and a second terminal coupled to the second voltage supply reference.

18. The row decoding circuit of claim 17, further comprising an logical enable block having a plurality of inputs receiving a plurality of pre-decoding signals and an output at which the enable signal is produced.

19. The row decoding circuit of claim 11, further comprising:
   a boost inverter having an input node, a power terminal, and an output node, the input node being responsive to a trigger signal;
   a boost switch having a control node coupled to the output node of the boost inverter, a first terminal coupled to the first voltage supply reference, and a second terminal coupled to the power terminal of the boost inverter; and
   a first boost capacitor coupled to the power terminal of the first inverter and to the second terminal of the boost switch.

20. The row decoding circuit of claim 11, further comprising first and second control transistors coupled between the first voltage supply reference and the power terminals of the first and second inverters, respectively, and receiving respectively first and second control signals indicating whether the row decoding circuit is in a read phase.

\* \* \* \* \*